United States Patent
Pyo et al.

(10) Patent No.: US 10,283,570 B2
(45) Date of Patent: *May 7, 2019

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Sangwoo Pyo, Hwaseong-si (KR); Hajin Song, Hwaseong-si (KR); Jihwan Yoon, Yongin-si (KR); Heunseung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/668,546

(22) Filed: Aug. 3, 2017

(65) Prior Publication Data

US 2017/0358634 A1 Dec. 14, 2017

Related U.S. Application Data

(63) Continuation of application No. 14/802,956, filed on Jul. 17, 2015, now Pat. No. 9,780,148.

(30) Foreign Application Priority Data

Aug. 20, 2014 (KR) .......................... 10-2014-0108316

(51) Int. Cl.
*H01L 51/50* (2006.01)
*H01L 51/52* (2006.01)
*H01L 27/32* (2006.01)

(52) U.S. Cl.
CPC ........ *H01L 27/3211* (2013.01); *H01L 51/504* (2013.01); *H01L 51/5265* (2013.01); *H01L 51/5218* (2013.01)

(58) Field of Classification Search
CPC . H01L 27/322; H01L 27/3211; H01L 52/504; H01L 52/5218; H01L 51/5056; H01L 51/5218

See application file for complete search history.

(56) References Cited

U.S. PATENT DOCUMENTS 7,471,041 B2   12/2008  Spindler
9,780,148 B2 * 10/2017  Pyo ..................... H01L 27/3211
(Continued)

FOREIGN PATENT DOCUMENTS

JP        4450051 B2     4/2010
JP      2010-118163 A    5/2010
(Continued)

OTHER PUBLICATIONS

Patent Abstracts of Japan for Japanese Publication No. 2009-123404, Corresponds to Japanese Patent No. 4450051 B2, Apr. 14, 2010, 1 Page.

(Continued)

*Primary Examiner* — Caridad Everhart
(74) *Attorney, Agent, or Firm* — Lewis Roca Rothgerber Christie LLP

(57) ABSTRACT

A display device includes a substrate having a red pixel region, a blue pixel region, and a green pixel region. An anode is on the substrate, a light-emitting layer is on the anode, and a cathode is on the light-emitting layer, wherein the light-emitting layer includes a red light-emitting layer emitting red light on the red pixel region, a blue light-emitting layer emitting blue light on the blue pixel region, and a green light-emitting layer emitting green light on the red pixel region, the blue pixel region, and the green pixel region. Each of the red light, the blue light, and the green light is resonated between the anode and the cathode.

19 Claims, 6 Drawing Sheets

(56) References Cited

U.S. PATENT DOCUMENTS

| | | | |
|---|---|---|---|
| 2004/0066824 | A1 | 4/2004 | Magno et al. |
| 2008/0246902 | A1 | 10/2008 | Cheng |
| 2010/0078631 | A1 | 4/2010 | Pieh |
| 2011/0074272 | A1 | 3/2011 | Sakamoto et al. |
| 2011/0291088 | A1 | 12/2011 | Seo et al. |
| 2013/0146853 | A1 | 6/2013 | Lee et al. |
| 2013/0147689 | A1 | 6/2013 | Liu et al. |
| 2013/0236999 | A1 | 9/2013 | Lee et al. |

FOREIGN PATENT DOCUMENTS

| | | |
|---|---|---|
| JP | 2012-79631 A | 4/2012 |
| KR | 10-0754127 B1 | 8/2007 |
| KR | 10-1182442 B1 | 9/2012 |
| KR | 10-2013-0072032 A | 7/2013 |
| WO | WO 2011/004421 A1 | 1/2011 |

OTHER PUBLICATIONS

Translation of JP 2010-118163 A, Sen (May 27, 2010), 19 Pages.
Korean Patent Abstracts for Korean Publication No. 10-2007-0081965 A, Corresponds to Korean Patent No. 10-0754127, 1 Page.
Korean Patent Abstracts for Korean Publication No. 10-2011-0087829 A, Corresponds to Korean Patent No. 10-1182442 B1, 1 Page.

* cited by examiner

DISPLAY DEVICE AND METHOD FOR MANUFACTURING THE SAME

CROSS-REFERENCE TO RELATED APPLICATION

This application is a continuation of U.S. patent application Ser. No. 14/802,956, filed Jul. 17, 2015, which claims priority to and the benefit of Korean Patent Application No. 10-2014-0108316, filed on Aug. 20, 2014, the entire contents of both of which are incorporated herein by reference.

BACKGROUND

The present disclosure herein relates to a display device and a method for manufacturing the same.

Flat display devices may be largely classified into two main groups such as a light emitting type and a light receiving type. Examples of the light emitting type are a flat cathode ray tube, a plasma display panel, an electroluminescent device and the like. An example of the light receiving type is a liquid crystal display. Among these, the electroluminescent device has advantages in that a viewing angle is wide, contrast is excellent, and a response speed is fast, and thus, has been receiving attention as a next generation display device. Such electro luminescent devices are classified into a non-organic electroluminescent device and an organic electroluminescent device according to a material that forms a light emitting layer.

Among these, the organic electroluminescent device is a self-emitting type of display that electrically excites a fluorescent organic compound to emit light, and since the organic electroluminescent device is operable at a low voltage and may be easily slimmed, the organic electroluminescent device receives attention as a next generation display having a wider viewing angle, a faster response speed and the like, in comparison to liquid crystal display.

The organic electroluminescent device has a light emitting layer including an organic material between an anode electrode and a cathode electrode. In the organic electroluminescent device, when anode and cathode voltages are applied on the electrodes, respectively, holes are moved from the anode electrode to the light emitting layer via a hole transfer layer, and electrons are moved from the cathode electrode to the light emitting layer via an electron transfer layer, and then the electrons and holes are recombined with each other in the light emitting layer to generate excitons. When the excitons are changed from an excited state to a ground state, fluorescent molecules in the light emitting layer emit light to form an image.

SUMMARY

The present disclosure provides a method for manufacturing a low cost and high quality display device.

The present disclosure also provides a display device manufactured through the method.

According to an aspect of an embodiment of the present disclosure, a display device may include: a substrate having a red pixel region, a blue pixel region, and a green pixel region; an anode on the substrate; a light-emitting layer on the anode; and a cathode on the light-emitting layer, wherein the light-emitting layer may include: a red light-emitting layer in the red pixel region and configured to emit red light; a blue light-emitting layer in the blue pixel region and configured to emit blue light; and a green light-emitting layer in the red pixel region, in the blue pixel region, and in the green pixel region, the green light-emitting layer being configured to emit green light.

The anode and the cathode may be configured such that each of the red light, and the blue light, and the green light resonates between the anode and the cathode.

The anode and the cathode may be configured such that the red light and the green light are primarily resonated, and the blue light is secondarily resonated.

The distance between the anode and the cathode at the red pixel region may be a first distance, a distance between the anode and the cathode at the green pixel region may be a second distance, and a distance between the anode and the cathode at the blue pixel region may be a third distance, and the second distance may be shorter than the first distance, and the first distance may be shorter than the third distance.

The display device may further include an auxiliary layer on the blue pixel region, the auxiliary layer being configured to adjust a gap between the blue light-emitting layer and the anode.

The red light-emitting layer may be on the green light-emitting layer, and the auxiliary layer may be between the green light-emitting layer and the blue light-emitting layer.

The display device may further include a first electron block layer between the green light-emitting layer and the red light-emitting layer, and a second electron block layer between the green light-emitting layer and the auxiliary layer.

The anode and the cathode include a reflecting member.

The anode may be a mirror, and the cathode may be a half-mirror.

The anode may be a half-mirror, and the cathode may be a mirror.

The display device may further include a hole function layer between the anode and the light-emitting layer.

The hole function layer may include a hole injection layer and an electron injection layer, which may be sequentially stacked on the anode.

The display device may further include an electron function layer between the light-emitting layer and the cathode.

The electron function layer may include an electron transfer layer and an electron injection layer, which may be sequentially stacked on the light-emitting layer.

According to another aspect of an embodiment of the present disclosure, a method for manufacturing a display device may include: forming an anode on a substrate; forming a light-emitting layer on the anode; and forming a cathode on the light-emitting layer, wherein the forming the light-emitting layer may include: forming a green light-emitting layer at a red pixel region, a green pixel region, and a blue pixel region of the substrate; forming a red light-emitting layer at the red pixel region; and forming a blue light-emitting layer at the blue pixel region.

The blue light-emitting layer and the red light-emitting layer may be formed by using a fine metal mask.

The method may further include forming an auxiliary layer between the anode and the blue light-emitting layer.

The auxiliary layer may be formed by using a fine metal mask.

The method may further include forming a first electron block layer on the green light-emitting layer at the red pixel region, wherein the red light-emitting layer may be formed on the first electron block layer at the red light-emitting layer.

The method may further include a second electron block layer on the green light-emitting layer at the blue pixel region, wherein the auxiliary layer may be formed on the second electron block layer, and the blue light-emitting layer may be formed on the auxiliary layer.

BRIEF DESCRIPTION OF THE DRAWINGS

The accompanying drawings are included to provide a further understanding of the present inventive concept, and are incorporated in and constitute a part of this specification. The drawings illustrate example embodiments of the present inventive concept and, together with the description, serve to explain principles of the present inventive concept. In the drawings.

DETAILED DESCRIPTION

Figure 1:
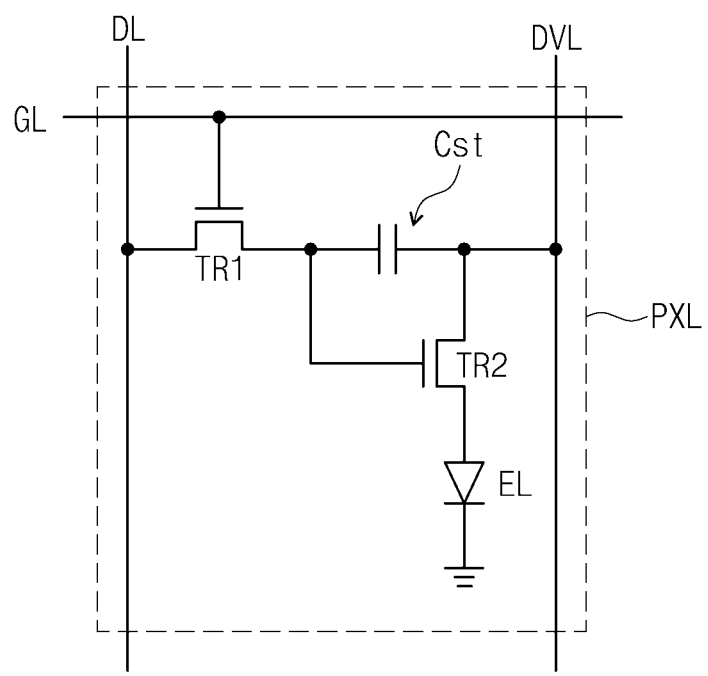
FIG. 1 is a circuit diagram showing a display device according to an embodiment of the present inventive concept.

Various changes may be made to the present inventive concept, and the embodiments of the present inventive concept may have various forms, and as such, example embodiments will be illustrated in the drawings and described in detail. However, such embodiments are not intended to limit the present inventive concept to the disclosed example embodiments and it should be understood that the embodiments include all changes, equivalents, and substitutes within the spirit and scope of the present invention.

Like reference numerals are used throughout the drawings to depict like or similar elements. In the drawings, the dimensions of structures may be exaggerated or reduced for clarity as compared to their actual sizes. It will be understood that although the terms first and second are used herein to describe various elements, these elements should not be limited by these terms. The terms are only used to distinguish one element from other elements. For example, a first element could be termed a second element, and, similarly, a second element could be termed a first element, without departing from the scope of the example embodiments. The terms referred to in a singular form may include the terms in the plural forms unless referred to the contrary.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. In the description, it will be understood that when an element such as a layer, film, region, or substrate is referred to as being "above," "on," "connected to," "connected with," or "coupled to" another element, it can be directly above, on, connected to, connected with, or coupled to the other element or intervening elements may also be present. In the description, it will be understood that when an element such as a layer, film, region, or substrate is referred to as being "directly above," "directly on," "directly connected to," or "directly coupled to" another element, there are no intervening elements or layers. As used herein, the term "and/or" includes any and all combinations of one or more of the associated listed items.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (e.g., rotated 90 degrees or at other orientations) and the spatially relative descriptors used herein may be interpreted accordingly.

Figure 2:
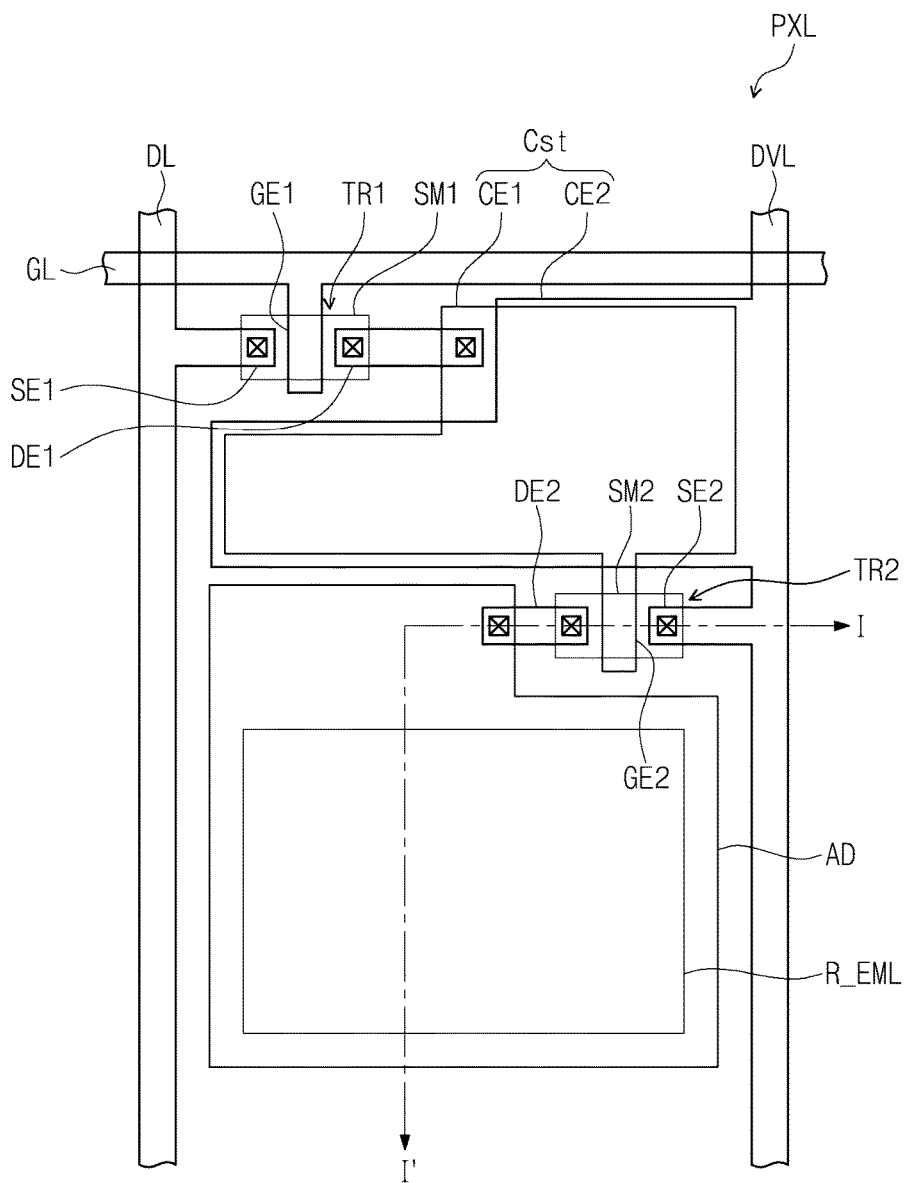
FIG. 2 is a plane view illustrating a pixel shown in FIG. 1.
Figure 3:
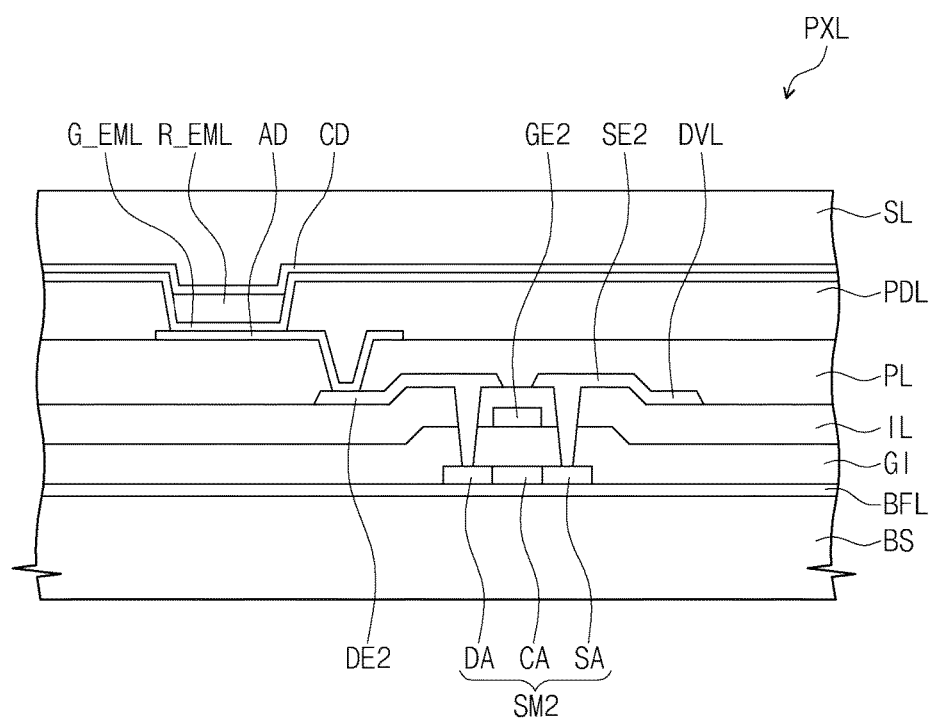
FIG. 3 is a cross-sectional view taken along the line I-I' of FIG. 2.

FIG. 1 is a circuit diagram showing one pixel of a display device according to an embodiment of the present inventive concept, FIG. 2 is a plane view illustrating a pixel shown in FIG. 1, and FIG. 3 is a cross-sectional view taken along the line I-I' of FIG. 2.

Hereinafter, a display device according to an embodiment of the present inventive concept will be described with reference to FIGS. 1 to 3.

A display device according to an embodiment of the present inventive concept includes a plurality of pixels PXL that provide an image. The pixels PXL may be arranged in a matrix form. The respective pixels PXL may display various colors, and in an embodiment of the present inventive concept, an example is shown and described such that each of the pixels emits a specific color light, for example, one of red light, green light, and green light. Hereinafter, color pixels emitting the specific color lights, a pixel emitting red light, a pixel emitting green light, and a pixel emitting blue light are referred to as a red pixel, a green pixel, and a blue pixel, respectively. The red pixel, the green pixel, and the blue pixel are provided on a red pixel region, a green pixel region, and a blue pixel region, respectively.

FIGS. 2 and 3 illustrate, by way of example, one red pixel of regions on which color pixels are provided, and the green pixel and the blue pixel also have substantially the same structure as the red pixel unless specified otherwise.

Here, while it is illustrated that each of the pixels PXL has a rectangular shape, the present inventive concept is not limited thereto, and each of the pixels PXL may be modified into various other suitable shapes. Also, the pixels PXL may have different areas (e.g., area sizes) from each other.

The pixel PXL includes a wiring part, a thin film transistor connected to the wiring part, an organic light emitting device (EL) connected to the thin film transistor, and a capacitor Cst. The wiring part may include a gate line GL, a data line DL and a driving voltage line DVL The gate line GL extends in one direction. The data line DL extends in another direction crossing the gate line GL. The driving voltage line DVL extends in substantially the same direction as the data line DL. The gate line GL transfers a scanning signal to the thin film transistor, the data line DL transfers a data signal to the thin film transistor, and the driving voltage line DVL applies a driving voltage to the thin film transistor.

The thin film transistor may include a driving thin film transistor TR2 to control the organic light emitting device EL, and a switching thin film transistor TR1 to switch the driving thin film transistor TR2. In an embodiment of the present inventive concept, while it is described that one pixel PXL includes two transistors TR1 and TR2, the present inventive concept is not limited thereto, and in other embodiments, one pixel PXL may include one thin film transistor and one capacitor, or one pixel PXL may include at least three thin film transistors and at least two capacitors.

The switching thin film transistor TR1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a gate electrode (e.g., a second gate electrode GE2) of the driving thin film transistor TR2. The switching thin film transistor TR1 transfers a data signal applied on the data line DL to the driving thin film transistor TR2 according to a scanning signal applied on the gate line GL.

The driving thin film transistor TR2 includes a second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the organic light emitting device EL.

The organic light emitting device EL includes an anode AD, a light-emitting layer EML on the anode AD, an electron transfer layer ETL on the light-emitting layer, and a cathode CD on the electron transfer layer ETL. The organic light emitting device EL will be described later.

The anode AD is connected to the second drain electrode DE2 of the driving thin film transistor TR2.

The capacitor Cst is connected between the second gate electrode GE2 and the second source electrode SE2 of the driving thin film transistor TR2, and charges and maintains a data signal inputted to the second gate electrode GE2 of the driving thin film transistor TR2.

A common voltage is applied to the cathode CD, and the light-emitting layer EML emits red light to display an image according to an output signal of the driving thin film transistor TR2.

Hereinafter, a display device according to an embodiment of the present inventive concept will be described according to a stacking order.

A display device according to an embodiment of the present inventive concept includes an insulating base substrate BS, such as glass, a plastic, a quartz or the like, on which a thin film transistor and an organic light emitting device EL are stacked.

A buffer layer BFL is formed on the base substrate BS. The buffer layer BFL prevents impurities from being diffused into the switching and driving thin film transistors TR1 and TR2. The buffer layer BFL may be formed of silicon nitride ($SiN_x$), silicon oxide ($SiO_x$), silicon oxynitride ($SiO_xN_y$) or the like, and may be omitted according to a material of the base substrate BS and a process condition.

A first semiconductor layer SM1 and a second semiconductor layer SM2 are provided on the buffer layer BFL. The first semiconductor layer SM1 and the second semiconductor layer SM2 are formed of a semiconductor material, and are operated as activation layers of the switching thin film transistor TR1 and the driving thin film transistor TR2, respectively. Each of the first semiconductor layer SM1 and the second semiconductor layer SM2 includes a source region SA, a drain region DA, and a channel region CA provided between the source region SA and the drain region DA. Each of the first semiconductor layer SM1 and the second semiconductor layer SM2 may be formed of an inorganic semiconductor or an organic semiconductor. The source region SA and the drain region DA may be doped with n-type impurities or p-type impurities.

A gate insulating layer GI is provided on each of the first semiconductor layer SM1 and the second semiconductor layer SM2.

The first gate electrode GE1 and the second gate electrode GE2 connected to a Gate line GL, are provided on the gate insulating layer GI. The first gate electrode GE1 and the second gate electrode GE2 are formed so as to cover regions corresponding to the channel regions CA of the first semiconductor layer SM1 and the second semiconductor layer SM2, respectively.

An insulating interlayer IL is provided on the first and second gate electrodes GE1 and GE2 so as to cover the first and second electrodes GE1 and GE2.

A first source electrode SE1 and a first drain electrode DE1, and a second source electrode SE2 and a second drain electrode DE2 are provided on the insulating interlayer IL. The first source electrode SE1 and the first drain electrode DE1 contact the source region SA and the drain region DA of the first semiconductor layer SM1 through contact holes formed in the gate insulating layer GI and the insulating interlayer IL, respectively. The second source electrode SE2 and the second drain electrode DE2 contact the source region SA and the drain region DA of the second semiconductor layer SM2 through contact holes formed in the gate insulating layer GI and the insulating interlayer IL, respectively.

A passivation film PL is provided on the first source electrode SE1 and the first drain electrode DE1, and the second source electrode SE2 and the second drain electrode DE2. The passivation film PL may function as a protection film for protecting the switching and driving thin film transistors TR1 and TR2, and function as a planarizing film for planarizing upper surfaces thereof.

An anode AD of the organic light emitting device EL is provided on the passivation film PL. The anode AD is connected to the second drain electrode DE2 of the driving thin film transistor TR2 through a contact hole formed in the passivation film PL.

A pixel definition film PDL defining a region on which a light-emitting layer is to be formed, is provided on the base substrate BS on which the anode AD and the like are formed. The pixel definition film PDL exposes an upper surface of the anode AD and protrudes from the base substrate BS along a periphery of each pixel PXL.

Light-emitting layers emitting red light, green light and blue light, are provided on regions surrounded by the pixel definition film PDL. A red light-emitting layer R_EML for emitting red light is provided on the region in the FIG. 1. Further, a green light-emitting layer G_EML, as well as the red light-emitting layer R_EML, is additionally provided on the red pixel as shown in FIG. 3, and this will be described later together with the green pixel and the blue pixel with reference to FIG. 4.

A cathode CD is provided on the light-emitting layer.

A sealing layer SL covering the cathode CD is provided on the cathode CD.

Figure 4:
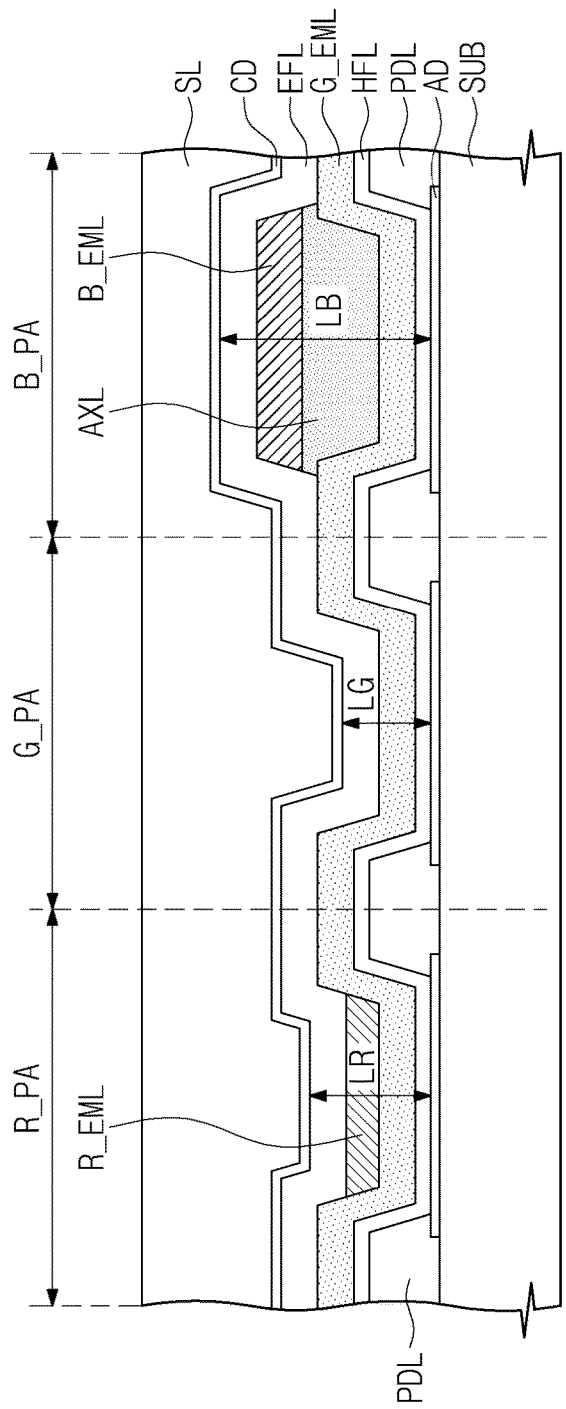
FIG. 4 is a cross-sectional view illustrating a red pixel region, a green pixel region and a blue pixel region of a display device according to an embodiment of the present inventive concept.

FIG. 4 is a cross-sectional view illustrating a red pixel region, a green pixel region and a blue pixel region of a display device according to an embodiment of the present inventive concept. In FIG. 4, elements between the base substrate and the anode AD are omitted for convenience of description, and the elements below the anode AD are expressed as a substrate SUB.

Referring to FIG. 4, an anode AD, a light-emitting layer, a cathode CD, and a sealing layer SL are provided on the substrate SUB. The light-emitting layer includes a red light-emitting layer R_EML, a green light-emitting layer G_EML, and a blue light-emitting layer B_EML.

In an embodiment of the present inventive concept, a hole function layer HFL may be provided between the anode AD and the light-emitting layer, and an electron function layer EFL may be provided between the light-emitting layer and the cathode CD. The hole function layer HFL and/or the electron function layer EFL may be provided as a single-layer or a multi-layer. In FIG. 4, an embodiment in which the hole function layer HFL and the electron function layer EFL are added to the embodiment of FIG. 3, is illustrated by way of example.

The anode AD is provided on the substrate SUB. The anode AD has conductivity, and may be comprised of, for example, indium tin oxide (ITO), indium zinc oxide (IZO), indium tin zinc oxide (ITZO) and/or the like.

The anode AD may be a mirror or a half-mirror (i.e., the anode AD may be reflective or semi-reflective). The anode AD may have a characteristic for reflecting at least a part of the light itself or may include a separate member for reflecting light. For example, the anode AD may be provided in the form of a metal film or a metal oxide film having reflectivity, or may be additionally provided with a dielectric mirror formed by alternately stacking materials having different dielectric constants, which is added to a conductivity film.

The hole function layer HFL may be provided on the anode AD. The hole function layer HFL may facilitate injection and transfer of holes to the light-emitting layer, and may be formed in a single-layer or a multi-layer. The hole function layer HFL may include at least one material of a hole injection layer material and a hole transfer layer material, which will be described later. In an embodiment of the present inventive concept, the hole function layer HFL may have a thickness of about 50 Å to about 10,000 Å, for example, about 100 Å to about 1,000 Å.

The hole function layer HFL may include a hole injection layer and/or a hole transfer layer. When the hole injection layer and the hole transfer layer are all provided, the hole injection layer and the hole transfer layer may be sequentially stacked on the anode AD.

The hole function layer HFL may or may not be provided separately to each pixel region, or may be a common layer that is provided to each pixel regardless of a color. In this case, a separate mask process (for example, a deposition process using a fine metal mask) may not be needed for forming the hole function layer HFL The hole injection layer HIL may use a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine,4,4',4"-tris(N,N'-di-phenyl-amino)triphenylamine (TDATA), 4,4',4"-tris{N,-(2-naphthyl)-N-phenylamino}-triphenylamine, 4,4',4"-tris{N,-(2-naphthyl)-N-phenylamino}triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/Poly(4-styrenesulfonate) (PANI/PSS) or the like, but the present inventive concept is not limited thereto.

The hole injection layer HIL may have a thickness of about 100 Å to about 10,000 Å, for example, about 100 Å to about 1,000 Å.

The hole injection layer HIL may include, for example, carbazole derivatives such as N-phenyl carbazole, polyvinyl carbazole or the like, triphenylamine-based derivatives such as N,N'-bis(3-methylphenyl)-N,N'-diphenyl-[1,1-biphenyl]-4,4'-diamine (TPD) or the like, N,N'-di(1-naphthyl)-N,N'-diphenylbenzidine (NPB), 4,4',4"-tris(N-carbazolyl)triphenylamine (TCTA), 4,4'-cyclohexylidenebis[N,N-bis(4-methylphenyl)benzenamine] (TAPC) or the like.

The hole transfer layer HTL may be formed with a thickness of about 50 Å to about 1,000 Å, for example, about 100 Å to about 800 Å.

The hole injection layer HIL, the hole transfer layer HTL, and/or the hole function layer HFL may include a charge-generation material for improving conductivity of a film as well as the hole injection material and the hole transfer material. The charge-generation material may be, for example, a p-type dopant. Nonrestrictive examples of the p-type dopant may be quinone derivatives such as tetracyanoquinodimethane (TCNQ), 2,3,5,6-tetrafluoro-tetracyano-1,4-benzoquinonedimethane (F4TCNQ) and the like, metal oxides such as tungsten oxide, molybdenum oxide and the like, a cyano group-containing compound and the like, but the present inventive concept is not limited thereto.

When the hole injection layer HIL, the hole transfer layer HTL or the hole function layer HFL further includes a charge-generation material, the charge-generation material may be homogeneously or unhomogeneously dispersed or may be distributed so as to have a concentration gradient.

The light-emitting layer may be provided on the red pixel region R_PA, the green pixel region G_PA, and the blue pixel region B_PA in different structures, respectively. However, the green light-emitting layer G_EML is provided as a common layer with respect to each color organic light emitting device EL. The red light-emitting layer G_EML may be formed with a thickness of about 50 Å to about 1,000 Å, for example, about 100 Å to about 500 Å or about 300 Å to about 400 Å.

A red light-emitting layer R_EML and a green light-emitting layer G_EML are provided on the red pixel region R_PA. The green light-emitting layer G_EML in the red pixel region R_PA is provided on the anode AD, and the red light-emitting layer R_EML is provided on the green light-emitting layer G_EML. The green light-emitting layer G_EML may be formed with a thickness of about 50 Å to about 1,000 Å, for example, about 100 Å to about 500 Å or about 300 Å to about 400 Å.

According to an embodiment, only a green light-emitting layer G_EML is provided on the green pixel region G_PA.

A blue light-emitting layer B_EML and a green light-emitting layer G_EML are provided on the blue pixel region R_PA. The green light-emitting layer G_EML in the blue pixel region B_PA is provided on the anode AD, and the blue light-emitting layer B_EML is provided on the green light-emitting layer G_EML. The blue light-emitting layer B_EML may be formed with a thickness of about 50 Å to about 1,500 Å, for example, about 500 Å to about 1,000 Å or about 700 Å to about 800 Å.

In an embodiment of the present inventive concept, an auxiliary layer AXL may be provided between the green light-emitting layer G_EML and the blue light-emitting layer B_EML. The auxiliary layer AXL adjusts a gap between the anode AD and the blue light-emitting layer B_EML, resultantly adjusting a length of an optical path between the anode AD and a cathode CD, which will be described later. In an embodiment of the present inventive concept, the blue light-emitting layer B_EML may be formed with a thickness of about 100 Å to about 300 Å, and the auxiliary layer AXL may be formed at a thickness of about 500 Å to about 800.

The light-emitting layer may include a host material and dopants expressing respective colors. For example, the red light-emitting layer R_EML, the green red light-emitting layer G_EML and the blue light-emitting layer B_EML may include a red dopant, a green dopant and a blue dopant, respectively.

The light-emitting layer may use, as the host material, tris(8-quinolinolato)aluminum (Alq3), 4,4'-bis(N-carbazolyl)-1,1'-biphenyl (CBP), poly(n-vinylcabazole) (PVK), 9,10-di(naphthalen-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP) or the like. The light-emitting layer may use, as the dopant, various dopants such as a fluorescent dopant, a phosphorescent dopant or the like. The phosphorescent dopant may be Ir, Pt, Os, Re, Ti, Zr and Hf or an organometallic complex including at least two combinations thereof.

In an embodiment of the present inventive concept, the red dopant may use Pt(II)octaethylporphine (PtOEP), tris(2-phenylisoquinoline)iridium (Ir(piq)3), bis(2-(2'-benzothienyl)-pyridinato-N,C3')iridium(acetylacetonate) (Btp2Ir(acac)) or the like.

In an embodiment of the present inventive concept, the green dopant may use tris(2-phenylpyridine)iridium (Ir(ppy)3), bis(2-phenylpyridine)(Acetylacetonato)iridium(III) (Ir(ppy)2(acac)), tris(2-(4-tolyl)phenylpyridine)iridium (Ir(m-ppy)3), 10-(2-benzothiazolyl)-1,1,7,7-tetramethyl-2,3,6,7-tetrahydro-1H,5H,11H-[1]benzopyrano[6,7,8-ij]-quinolizin-11-one (C545T) or the like.

In an embodiment of the present inventive concept, the blue dopant may use bis[3,5-difluoro-2-(2-pyridyl)phenyl](picolinato)iridium(III) (F2Irpic), (F2ppy)2Ir(tmd), Ir(dfppz)3, 4,4'-bis(2,2'-diphenylethen-1-yl)biphenyl (DPVBi), 4,4'-Bis[4-(diphenylamino)styryl]biphenyl (DPAVBi), 2,5,8,11-tetra-tert-butylperylene (TBPe) or the like.

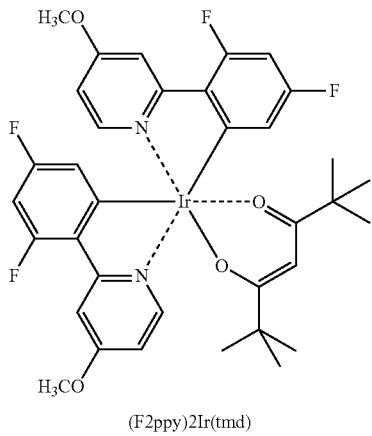

(F2ppy)2Ir(tmd)

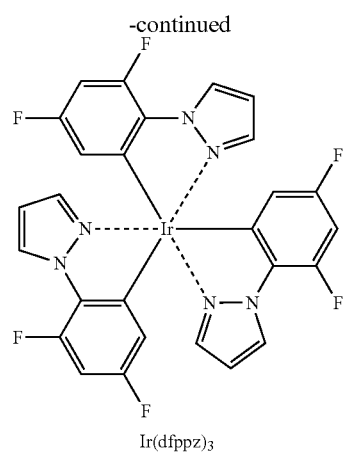

Ir(dfppz)3

In an embodiment of the present inventive concept, when the light-emitting layer includes a host and a dopant, the content of the dopant content may be typically selected within a range of about 0.01 parts by weight to about 15 parts by weight with respect to about 100 parts by weight of the host.

An electron function layer EFL may be provided on the light-emitting layer. The electron function layer EFL may facilitate injection and transfer of electrons to the light-emitting layer, and may be formed in a single-layer or a multi-layer. In some embodiments, the electron function layer EFL may include at least one material of an electron injection layer material and an electron transfer layer material, which will be described later.

In some embodiments, the electron function layer EFL may include an electron injection layer and/or an electron transfer layer. When the electron injection layer and the electron transfer layer are both provided, the electron injection layer and the electron transfer layer may be sequentially stacked on the light-emitting layer.

In some embodiments, the electron function layer EFL may or may not be provided separately to each pixel region, or may be a common layer that is provided to each pixel regardless of a color. In this case, a separate mask process (for example, a deposition process using a fine metal mask) may not be needed for forming the electron function layer EFL.

The electron transfer layer ETL may include, for example, materials such as tris(8-hydroxyquinolinato)aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1'-Biphenyl-4-olato)aluminum (BAlq), berylliumbis(benzoquinolin-10-olate) (Bebq2), 9,10-di(naphthalene-2-yl)anthracene (AND) or the like.

The electron transfer layer ETL may have a thickness of about 200 Å to about 500 Å, or about 250 Å to about 450 Å.

The electron injection layer EIL may be provided on a surface of the electron transfer layer ETL, and may include a metal-containing material. The metal-containing material may be LiF, lithium quinolate (LiQ), $Li_2O$, BaO, NaCl, CsF or the like. The electron injection layer EIL may be formed by vacuum heat-deposition or spin-coating an electron injection layer material on the surface of the electron transfer layer ETL through methods known to those skilled in the art. Also, the electron injection layer EIL may include a material in which an electron transfer material and insulating organic metal salt are mixed. The organic metal salt may be a material having an energy band gap of about 4 eV or more. In detail, the organic metal salt may include, for example, metal acetate, metal benzoate, metal acetoacetate, metal acetylacetonate or metal stearate.

The cathode CD may include a metal or an alloy having a low work function, an electro conductive compound, or a mixture thereof. For example, the cathode CD may be comprised of lithium (Li), magnesium (Mg), aluminum (Al), aluminum-lithium (Al—Li), calcium (Ca), magnesium-indium (Mg—In), magnesium-silver (Mg—Ag) or the like.

The cathode CD may be a mirror or a half-mirror (i.e., the cathode CD may be reflective or semi-reflective). The cathode CD may have a characteristic for reflecting at least a part of the light itself or may include a separate member for reflecting the light. For example, the cathode CD may be provided in the form of a metal film or a metal oxide film having reflectivity, or may be additionally provided with a dielectric mirror formed by alternately stacking materials having a different dielectric constant, which is added to a conductivity film.

According to an embodiment of the present inventive concept, when the anode AD is a mirror, the cathode CD may be a half-mirror. According to another embodiment, when the anode AD is a half-mirror, the cathode CD may be a mirror. The anode AD and the cathode CD may transmit and/or reflect light, or partially transmit and/or reflect light to allow the light to resonate between the anode AD and the cathode CD. For this purpose, a distance between the cathode CD and the anode AD may be set to an N multiple of ½wavelength of the light to be resonated (where N is a natural number). In an embodiment of the present inventive concept, in a case of the red pixel and the green pixel, N corresponds to 1 (that is, a primary resonance), and in a case of the blue pixel, N corresponds to 2 (that is, a secondary resonance).

In an embodiment of the present inventive concept, two mirrors causing a resonance are the cathode CD and the anode AD, but the present inventive concept is not limited thereto. In addition to the cathode CD and the anode AD, another element having reflectivity may be provided with the light-emitting layer in-between. For example, a person having ordinary skill in the art would understand that one of insulating layers of the substrate SUB, instead of the anode AD, may be formed as a dielectric mirror.

Referring to FIG. 4, in an embodiment of the present inventive concept, when distances between the anode AD and the cathode CD in the red pixel region R_PA, the green pixel region G_PA, and the blue pixel region B_PA are referred to as a first distance LR, a second distance LG, and a third distance LB, respectively, the first distance LR is set to a distance where red light causes a resonance, the second distance is set to a distance where green light causes a resonance, and the third distance is set to a distance where blue light causes a resonance.

In an embodiment of the present inventive concept, the first to third distances LR, LG and LB are set such that the red light and the green light are primarily resonated, and the blue light is secondarily resonated. According to the embodiments of the present inventive concept, when resonating in the same order, because a resonance distance of the red light is shorter than that of the green light, the second distance LG is shorter than the first distance LR. The blue light has a resonance distance shorter than those of the red light and the green light when resonating in the same order, but may have a resonance distance longer than those of the red light and the green light in one order-higher resonance as in the example embodiments of the present inventive concept. Accordingly, the third distance LB may be longer than the first distance LR.

An auxiliary layer AXL may be provided on the blue pixel region B_PA such that a distance between the anode AD and the cathode CD satisfies the third distance LB when the blue light is secondarily resonated. The auxiliary layer AXL adjusts a length of a light path in the resonance structure, and may be comprised of a material forming the hole injection layer and/or the hole transfer layer.

The display device having the above-described structure may function as a display device in which blue light, red light and green light emitted from respective light-emitting layers are visible to a user's eyes to display a color image. Here, the green light-emitting layer G_EML on the blue pixel area B_PA and the red pixel region R_PA functions as a hole function layer rather than as a light-emitting layer, and even though the green light-emitting layer functions as a light-emitting layer to emit green light, the emitted green light is dissipated by a destructive interference due to the resonance structure.

A method for manufacturing the display device having the aforementioned structure will be described with reference to FIGS. 3 and 4 as follows.

In some embodiments, an anode AD is formed on the substrate SUB. The substrate SUB may be manufactured by performing photolithography a plurality of times.

The anode AD may be formed of a material such as a metal, or a transparent metal oxide, for example, indium tin oxide (ITO), indium zinc oxide (IZO), indium gallium zinc oxide (IGZO) or the like through a deposition method or the like.

A hole function layer HFL, a light-emitting layer, and an electron function layer EFL are sequentially formed on the anode AD. The hole function layer HFL, the light-emitting layer, and the electron function layer EFL may be independently formed by using a vacuum deposition method, a spin coating method, a casting method, a Langmuir-Blodgett (LB) method or the like.

In some embodiments, the electron function layer HFL is a common layer and is formed on all of a red pixel region R_PA, a green pixel region G_PA, and a blue pixel region B_PA.

A light-emitting layer is formed on the hole function layer HFL corresponding to each color pixel region. In some embodiments, a green light-emitting layer G_EML is formed on all of a red pixel region R_PA, a green pixel region G_PA, and a blue pixel region B_PA of the substrate. The green light-emitting layer G_EML is a common layer, may be formed through deposition, and does not utilize a separate fine metal mask because the green light-emitting layer G_EML is formed on all of the three pixel regions.

In some embodiments, a red light-emitting layer R_EML is formed on the green light-emitting layer G_EML of the red pixel region R_PA. The red light-emitting layer R_EML may be formed through a deposition method using a fine metal mask.

Thereafter, a blue light-emitting layer B_EML is formed on the green light-emitting layer G_EML of the blue pixel region B_PA.

The blue light-emitting layer G_EML may be formed through a deposition method using a fine metal mask. Here, when forming the blue light-emitting layer G_EML, the blue light-emitting layer G_EML may be thickly formed so as to satisfy a resonance distance of blue light. Meanwhile, before forming the blue light-emitting layer G_EML, an auxiliary layer AXL for securing a resonance distance of blue light is further formed, and then the blue light-emitting layer B_EML may be formed. In this case, the auxiliary layer AXL and the blue light-emitting layer B_EML may be formed through a deposition method using a fine metal mask.

In manufacturing the display device through the aforementioned method, the number of fine metal masks is reduced compared to an existing method for manufacturing a display device, thereby reducing the time required and manufacturing costs.

Some display devices have adopted a structure in which all of red light, green light and blue light are secondarily resonated. In this case, a hole function layer is utilized for having a sufficient thickness for maintaining a secondary resonance. Also, in order to secure a resonance distance of red light, green light, and blue light, all of the red pixel, the green pixel, and the blue pixel utilize an auxiliary layer. The auxiliary layers of the red pixel, the green pixel and the blue pixel are manufactured using an additional fine metal mask. However, the existing display device may adopt a structure in which all of red light, green light and blue light are primarily resonated, but, in this case, it is difficult to obtain a sufficient optical distance for resonating blue light.

Aside from this, the existing display device may adopt a structure in which red light and green light are primarily resonated, and blue light is secondarily resonated. However, in this case, since the red light-emitting layer, the green light-emitting layer, and the blue light-emitting layer are formed as separate layers on the red pixel region, the green pixel region, and the blue pixel region, respectively, separate masks for the red light-emitting layer, the green light-emitting layer, and the blue light-emitting layer are respectively utilized.

However, in an embodiment of the present inventive concept, at first, in a case of the blue pixel region, a thickness of the additional auxiliary layer is thinned due to a green auxiliary layer that exists as a common layer. As a result, the thickness of the auxiliary layer is also reduced by about 36% to result in a reduction in materials of the light-emitting layer and the auxiliary layer.

Second, according to an embodiment of the present inventive concept, since the auxiliary layer is utilized only for the blue pixel, an additional mask is not utilized for auxiliary layers for the other color pixels.

Third, according to an embodiment of the present inventive concept, since the green light-emitting layer is formed as the common layer, a separate mask is not utilized for forming the green light-emitting layer.

Fourth, adopting a structure in which red light and green light are primarily resonated, and blue light is secondarily resonated, it is not necessary to maintain a second resonance, and thus, for example, a thickness of the hole function layer and a thickness of each light-emitting layer may be provided as thin as possible (e.g., sufficiently thin). According to an embodiment of the present inventive concept, thicknesses of the red light-emitting layer and the green light-emitting are reduced by about 50% or more compared to the existing display device that adopts a second resonance.

Fifth, according to an embodiment of the present inventive concept, since the green pixel has a primary resonance structure, a thick hole function layer is not utilized, and as a result, a thickness of the hole function layer is thinned to reduce a driving voltage (for example, about 0.9 V).

Figure 5:
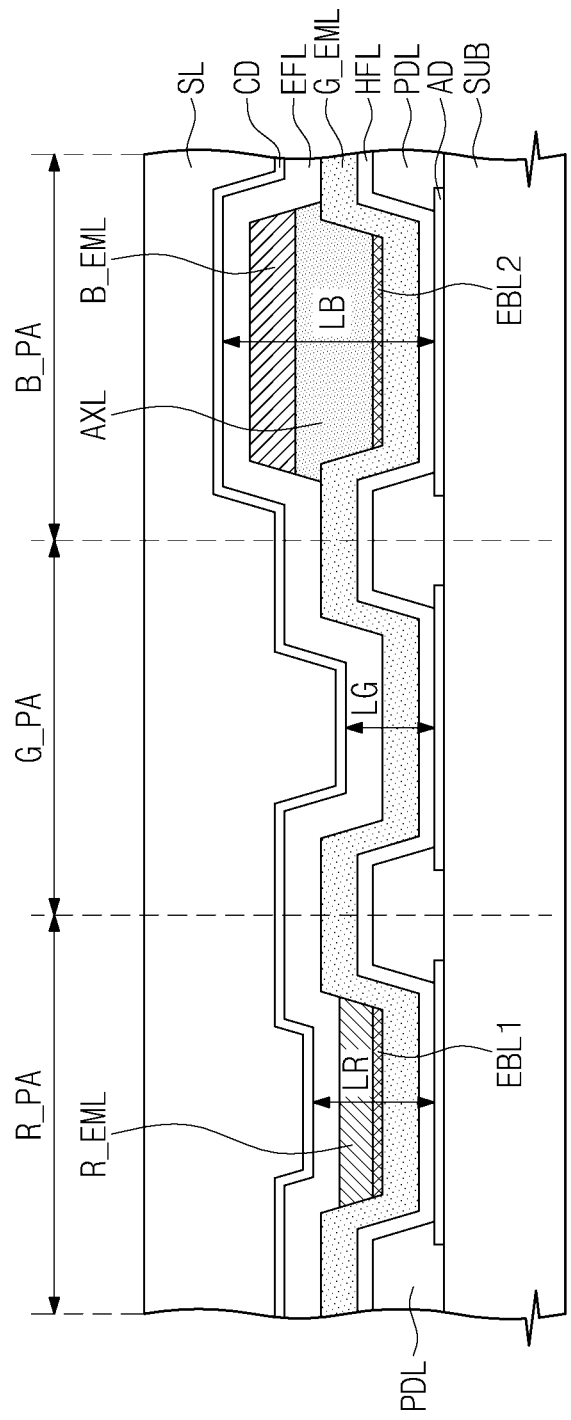
FIG. 5 is a cross-sectional view illustrating a red pixel region, a green pixel region and a blue pixel region of a display device according to another embodiment of the present inventive concept.

FIG. 5 is a cross-sectional view illustrating a red pixel region R_PA, a green pixel region G_PA and a blue pixel region B_PA of a display device according to another embodiment of the present inventive concept. In another embodiment of the present inventive concept, portions that differ from an embodiment of the present inventive concept will be described in more detail to avoid repeating the same description, and elements that are not described will be appreciated as being the same as in an embodiment of the present inventive concept.

Referring to FIG. 5, a display device according to another embodiment of the present inventive concept further includes an electron block layer. The electron block layer is provided on the red pixel region R_PA and the blue pixel region B_PA, and includes a first electron block layer EBL1 that is provided between the green light-emitting layer G_EML and the red light-emitting layer R_EML, and a second electron block layer EBL2 that is provided between the green light-emitting layer G_EML and the auxiliary layer AXL.

The first electron block layer EBL1 and the second electron block layer EBL2 in the red pixel region R_PA and the blue pixel region B_PA, prevent green light from being emitted in the green light-emitting layer G_EML and concurrently, allow the green light-emitting layer G_EML to substantially function as a hole function layer HFL. That is, the first electron block layer EBL1 and the second electron block layer EBL2 are arranged between the green light-emitting layer G_EML on a lower portion thereof and the red light-emitting layer R_EML on an upper portion thereof, and between the green light-emitting layer G_EML on the lower portion and the auxiliary layer AXL on the upper portion, respectively, to prevent electrons and excitons in the red light-emitting layer R_EML and the blue light-emitting later B_EML from entering the green light-emitting layer G_EML. Here, a material forming the first and second electron block layers EBL1 and EBL2 may be selected from materials having sufficiently high energy barrier (for example, a LUMO energy level much lower than that of the light-emitting layer) such that high energy electrons are much less likely to enter the green light-emitting layer G_EML from the light-emitting layer. The electron block layer may also prevent excitons from being diffused from the light-emitting layer. As a result, green light emission may be suppressed in the red pixel region R_PA and the blue pixel region B_PA to emit high purity red light and blue light.

The electron block layer may be formed of, but not particularly limited to, a material obtained by doping a p-dopant, for example, 1,4,5,8,9,11-hexaazatriphenylene-hexacarbonitrile (HAT-CN) or 2-(7-dicyanomethylene-1,3,4,5,6,8,9,10-octafluoro-7H-pyrene-2-ylide-ne)-malononitrile (NDP-9) on the hole function layer HFL.

Figure 6:
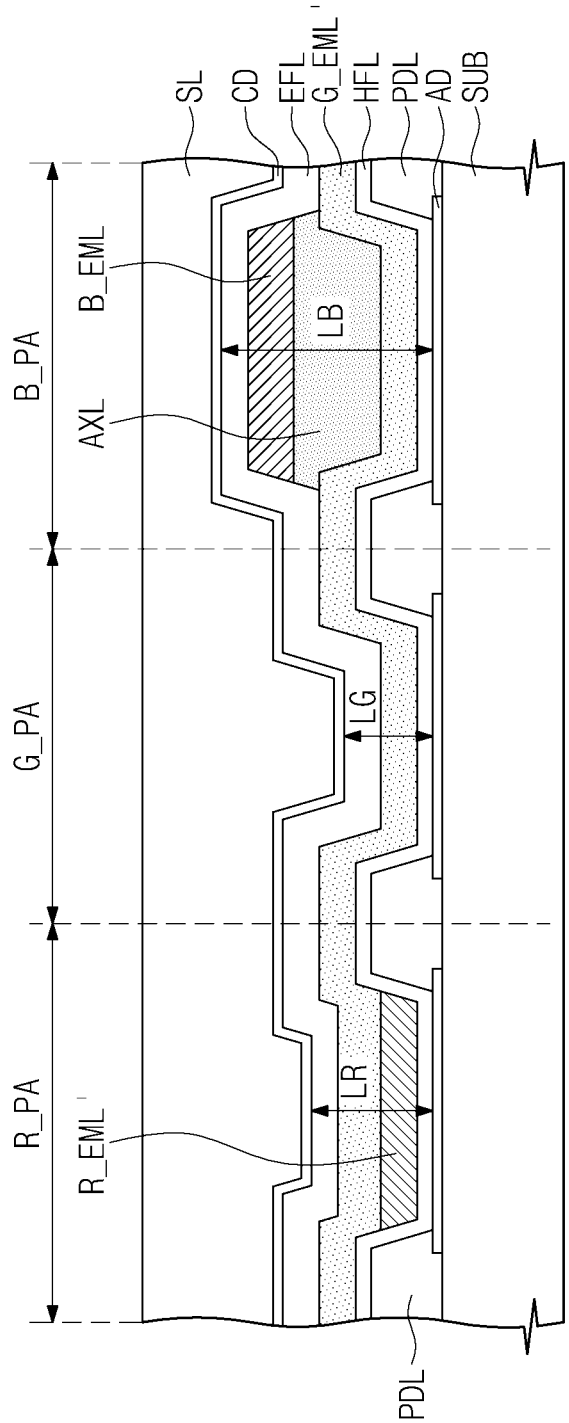
FIG. 6 is a cross-sectional view illustrating a red pixel region, a green pixel region and a blue pixel region of a display device according to another embodiment of the present inventive concept.

FIG. 6 is a cross-sectional view illustrating a red pixel region R_PA, a green pixel region G_PA and a blue pixel region B_PA of a display device according to an embodiment of the present inventive concept. In another embodiment of the present inventive concept, portions that differ from the previously described embodiments will be mainly described in more detail in order to prevent repeating the description, and elements that are not described will be appreciated as being the same as in the previously described embodiments.

Referring to FIG. 6, in a display device according to another embodiment of the present inventive concept, a green light-emitting layer G_EML' is formed on a red light-emitting layer R_EML' of a red pixel region R_PA. The red light-emitting layer R_EML' may be formed through a deposition method using a fine metal mask.

When the red light-emitting layer R_EML' is arranged at a lower portion of (e.g., below) the green light-emitting layer G_EML', it is difficult for the holes injected from an anode AD to move toward the green light-emitting layer G_EML. Therefore, since is a possibility that electrons and holes are recombined in the green light-emitting layer G_EML' is reduced in the red pixel region R_PA, as a result, green light emission may be suppressed in the red pixel region R_PA to emit high purity red light.

According to an embodiment of the present inventive concept, provided is a method for manufacturing a display device at low cost and reducing consumption of a material.

Also, provided is a high quality display device manufactured according to the method.

Further, while the present inventive concept has been particularly shown and described with reference to example embodiments thereof, it will be understood by those having ordinary skill in the art that various changes in form and details may be made therein without departing from the substantial features of the embodiments. For example, each element specifically appearing in the embodiment may be carried out through a modification. All differences related in the modification and application thereof will be construed as being included within the scope of the invention as defined by the following claims and their equivalents.

For example, the embodiments of the present inventive concept are disclosed so as to have different structure, but may also have a shape where elements are combined or substituted with each other without being incompatible with each other.

Therefore, the technical scope of the present inventive concept is not limited to the descriptions in the Detailed Description of the specification, but should rather be only defined by scopes of claims and their equivalents.

What is claimed is:

1. A display device comprising:
    a substrate having a red pixel region, a blue pixel region, and a green pixel region;
    an anode on the substrate;
    a hole function layer on the anode;
    a light-emitting layer on the hole function layer; and
    a cathode on the light-emitting layer,
    wherein the light-emitting layer comprises:
        a red light-emitting layer in the red pixel region and configured to emit red light;
        a blue light-emitting layer in the blue pixel region and configured to emit blue light; and
        a green light-emitting layer in the red pixel region, in the blue pixel region, and in the green pixel region, the green light-emitting layer being configured to emit green light and not configured to emit blue light, and
    wherein the hole function layer includes a p-type dopant.

2. The display device of claim 1, wherein the p-type dopant includes quinone derivatives, metal oxides or a cyano group-containing compound.

3. The display device of claim 1, further comprising a first electron block layer between the green light-emitting layer and the red light-emitting layer at the red pixel region, and a second electron block layer between the green light-emitting layer and the blue light-emitting layer at the blue pixel region.

4. The display device of claim 1, wherein the anode and the cathode are configured such that each of the red light, the blue light, and the green light resonates between the anode and the cathode.

5. The display device of claim 4, wherein the anode and the cathode are configured such that the red light and the green light are primarily resonated, and the blue light is secondarily resonated.

6. The display device of claim 5, wherein a distance between the anode and the cathode at the red pixel region is a first distance, a distance between the anode and the cathode at the green pixel region is a second distance, and a distance between the anode and the cathode at the blue pixel region is a third distance, and wherein the second distance is shorter than the first distance, and the first distance is shorter than the third distance.

7. A display device comprising:
    a substrate having a red pixel region, a blue pixel region, and a green pixel region;
    an anode on the substrate;
    a hole function layer on the anode;
    a light-emitting layer on the hole function layer; and
    a cathode on the light-emitting layer,
    wherein the light-emitting layer comprises:
        a red light-emitting layer in the red pixel region and configured to emit red light;
        a blue light-emitting layer in the blue pixel region and configured to emit blue light; and
        a green light-emitting layer in the red pixel region, in the blue pixel region, and in the green pixel region, the green light-emitting layer being configured to emit green light and not configured to emit blue light, and
    wherein the green light-emitting layer includes Iridium complex compounds.

8. A display device comprising:
    a substrate having a red pixel region, a blue pixel region, and a green pixel region;
    an anode on the substrate;
    a hole function layer on the anode;
    a light-emitting layer on the hole function layer;
    a cathode on the light-emitting layer; and
    an electron transfer layer disposed between the light-emitting layer and the cathode,
    wherein the light-emitting layer comprises:
        a red light-emitting layer in the red pixel region and configured to emit red light;
        a blue light-emitting layer in the blue pixel region and configured to emit blue light; and
        a green light-emitting layer in the red pixel region, in the blue pixel region, and in the green pixel region, the green light-emitting layer being configured to emit green light and not configured to emit blue light.

9. The display device of claim 8, wherein a distance between the anode and the cathode at the green pixel region is a second distance,
    the second distance is a sum of thicknesses of the hole function layer, the green light-emitting layer and the electron transfer layer at the green pixel region,
    a thickness of the hole function layer at the green pixel region is about 100 Å to about 1,000 Å,
    a thickness of the green light-emitting layer at the green pixel region is about 300 Å to about 400 Å, and
    a thickness of the electron transfer layer at the red pixel region is about 250 Å to about 450 Å.

10. The display device of claim 8, wherein a distance between the anode and the cathode at the red pixel region is a first distance, the first distance is a sum of thicknesses of the hole function layer, the green light-emitting layer, the red light-emitting layer and the electron transfer layer at the red pixel region, a thickness of the hole function layer at the red pixel region is about 100 Å to about 1,000 Å, a thickness of the green light-emitting layer at the red pixel region is about 300 Å to about 400 Å, a thickness of the red light-emitting layer at the red pixel region is about 300 Å to about 400 Å, and a thickness of the electron transfer layer at the red pixel region is about 250 Å to about 450 Å.

11. The display device of claim 10, wherein the hole function layer includes a the hole injection layer having a thickness of about 100 Å to about 1,000 Å.

12. The display device of claim 8, further comprising an auxiliary layer directly contacting the blue light-emitting layer on the blue pixel region, and wherein a distance between the anode and the cathode at the blue pixel region is a third distance, the third distance is a sum of thicknesses of the hole function layer, the green light-emitting layer, the blue light-emitting layer, the auxiliary layer and the electron transfer layer at the blue pixel region, a thickness of the hole function layer at the blue pixel region is about 100 Å to about 1,000 Å, a thickness of the green light-emitting layer at the blue pixel region is about 300 Å to about 400 Å, a thickness of the blue light-emitting layer at the blue pixel region is about 100 Å to about 300 Å, a thickness of the blue light-emitting layer at the blue pixel region is about 100 Å to about 300 Å, and a thickness of the auxiliary layer at the blue pixel region is about 500 Å to about 800 Å.

13. The display device of claim 12, wherein the red light-emitting layer is on the green light-emitting layer, and the auxiliary layer is between the green light-emitting layer and the blue light-emitting layer.

14. A display device comprising:

a substrate having a red pixel region, a blue pixel region, and a green pixel region;

a mirror on the substrate;

a half-mirror on the substrate and spaced apart from the mirror;

a hole function layer between the mirror and the half-mirror; and a light-emitting layer between the mirror and the half-mirror, wherein the light-emitting layer comprises:

a red light-emitting layer in the red pixel region and configured to emit red light;

a blue light-emitting layer in the blue pixel region and configured to emit blue light; and a green light-emitting layer in the red pixel region, in the blue pixel region, and in the green pixel region, the green light-emitting layer being configured to emit green light and not configured to emit blue light.

15. The display device of claim 14, wherein one of the mirror and the half-mirror is an anode, and the other one of the mirror and the half-mirror is a cathode.

16. The display device of claim 15, wherein the anode includes at least an indium tin oxide (ITO), an indium zinc oxide (IZO) or an indium tin zinc oxide (ITZO), and the cathode includes at least a lithium (Li), a magnesium (Mg), an aluminum (Al), an aluminum-lithium (Al—Li), a calcium (Ca), a magnesium-indium (Mg—In) or a magnesium-silver (Mg—Ag).

17. The display device of claim 14, wherein the mirror and the half-mirror are configured such that each of the red light, the blue light, and the green light resonates between the mirror and the half-mirror.

18. The display device of claim 17, further comprising an electron transfer layer disposed between the mirror and the half-mirror, wherein the light-emitting layer is disposed between the hole function layer and the electron transfer layer.

19. The display device of claim 18, wherein a distance between the mirror and the half-mirror at the red pixel region is a first distance, the first distance is a sum of thicknesses of the hole function layer, the green light-emitting layer, the red light-emitting layer and the electron transfer layer at the red pixel region, a thickness of the hole function layer at the red pixel region is about 100 Å to about 1,000 Å, a thickness of the green light-emitting layer at the red pixel region is about 300 Å to about 400 Å, a thickness of the red light-emitting layer at the red pixel region is about 300 Å to about 400 Å, and a thickness of the electron transfer layer at the red pixel region is about 250 Å to about 450 Å.

* * * * *